United States Patent [19]

Frerking

[11] 4,126,853
[45] Nov. 21, 1978

[54] NON-LINEAR DIGITAL-TO ANALOG CONVERSION

[75] Inventor: Marvin E. Frerking, Cedar Rapids, Iowa

[73] Assignee: Rockwell International Corporation, El Segundo, Calif.

[21] Appl. No.: 833,857

[22] Filed: Sep. 16, 1977

Related U.S. Application Data

[63] Continuation of Ser. No. 629,169, Nov. 5, 1975, abandoned.

[51] Int. Cl.² .......................................... H03K 13/20
[52] U.S. Cl. ............................................. 340/347 DA
[58] Field of Search ................................. 340/347 DA

[56] References Cited

U.S. PATENT DOCUMENTS

| | | | |
|---|---|---|---|
| 3,422,423 | 1/1969 | Kaszynski | 340/347 DA |
| 3,632,996 | 1/1972 | Anderson | 340/347 DA |
| 3,754,235 | 8/1973 | Dummermuth | 340/347 DA |
| 3,823,396 | 7/1974 | Lode | 340/347 DA |
| 3,838,416 | 9/1974 | Brown | 340/347 DA |

Primary Examiner—Charles D. Miller
Attorney, Agent, or Firm—Howard R. Greenberg; H. Fredrick Hamann

[57] ABSTRACT

Non-linear digital-to-analog conversion is performed by employing a plurality of counting rates and counting intervals in a digital counter to generate a variable width pulse, the width of which determines the desired analog value corresponding to the digital value to be converted.

9 Claims, 4 Drawing Figures

NON-LINEAR DIGITAL-TO ANALOG CONVERSION

BACKGROUND OF THE INVENTION

This is a continuation of application Ser. No. 629,169, filed Nov. 5, 1975.

The present invention pertains generally to digital-to-analog conversion techniques and specifically to a method and apparatus of performing non-linear digital-to-analog conversion.

The dramatic growth of digital electronics, as exemplified by the computer and data communications fields, has created a cogent need for digital-to-analog (d/a hereinafter) converters for transforming the digital signals employed in digital processing to analog signals that are representative of continuously varying physical phenomena as found in nature and therefore in a form usable in the real world. Although converters employing various techniques have proliferated to meet this need, the type of conversion engendered for the most part has been linear; viz. a percent change in the digital value to be converted gives rise to the same percent change in the corresponding analog value produced thereby. Non-linear conversion, such as might be required for digitally tuning a communications receiver filter whose tuning characteristics are rarely linear, entails the use of greater or specialized circuitry which necessarily increases the cost and complexity of the converter. For example, one approach is to first convert each digital value to be converted to the digital value whose corresponding analog value is the one desired before performing a linear d/a conversion. As may well be appreciated, this requires a large capacity memory storage unit, there being as many addresses or memory locations as there are discrete digital values since there is a one-to-one digital translation correspondence. A second approach is to follow a linear d/a conversion with a piece-meal linear-wise approximation process to simulate the non-linear digital-analog curve, thereby combining both digital and analog techniques in the conversion process.

With the foregoing in mind, it is a primary object of the present invention to provide a wholly digital technique for performing non-linear d/a conversion.

It is a further object of the present invention to provide such a digital technique which minimizes the amount of circuitry required including that associated with the memory storage unit.

The foregoing objects, as well as others, and the means by which they are achieved may best be comprehended by referring to the Detailed Description of the Invention which follows hereinafter together with the appended drawings.

BRIEF DESCRIPTION OF THE INVENTION

In accordance with the stated objects, the subject invention entails generating a variable width pulse from which the desired analog value is obtained as a function of its width. The pulse width is determined by the time for a counter that provides a predetermined maximum count to count up to the digital value to be converted while employing a plurality of counting rates and counting intervals. The pulse width is transformed into a proportional analog value by either averaging the pulse over the time for the counter to achieve its predetermined count or integrating it. By suitably selecting the counting intervals and corresponding counting rates, any non-linear (ascending) curve can be simulated.

DETAILED DESCRIPTION OF THE INVENTION

Figure 1:
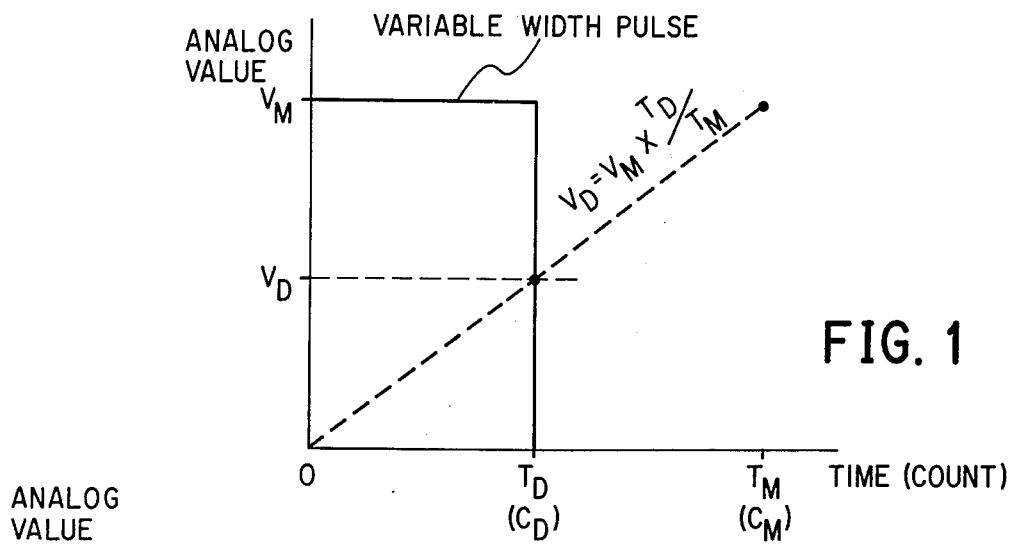
FIG. 1 depicts the variable width pulse used to obtain the desired corresponding analog value.

As shown in FIG. 1, a variable width pulse having a time duration $T_D$ may be used to develop an analog signal $V_D$ which is proportionately representaive of a given digital value $C_D$ (represented as a decimal count herein) by employing a digital counter having a uniform counting rate. If the pulse is made to last so long as the period $T_D$ necessary for the counter to achieve the digital count $C_D$ for conversion and the counter counts to a predetermined maximum count of $C_M$ in time period $T_M$, then the analog equivalent signal magnitude $V_D = V_M \times (T_D/T_M)$ ($V_M$ being equal to the pulse magnitude) which lies along the dashed ramp. This signal $V_D$ can be physically obtained either by averaging the pulse over time period $T_M$, for example by applying it to a lowpass filter or integrating it. In either case it will be noted that linearity is intrinsic to this technique, a percent change in the digital value $C_D$ giving rise to a like percent change in the analog value $V_D$ so that it cannot by itself possibly be used for non-linear d/a conversion. The foregoing is not novel and as a matter of fact has been used in some prior art linear d/a converters.

Figure 2:
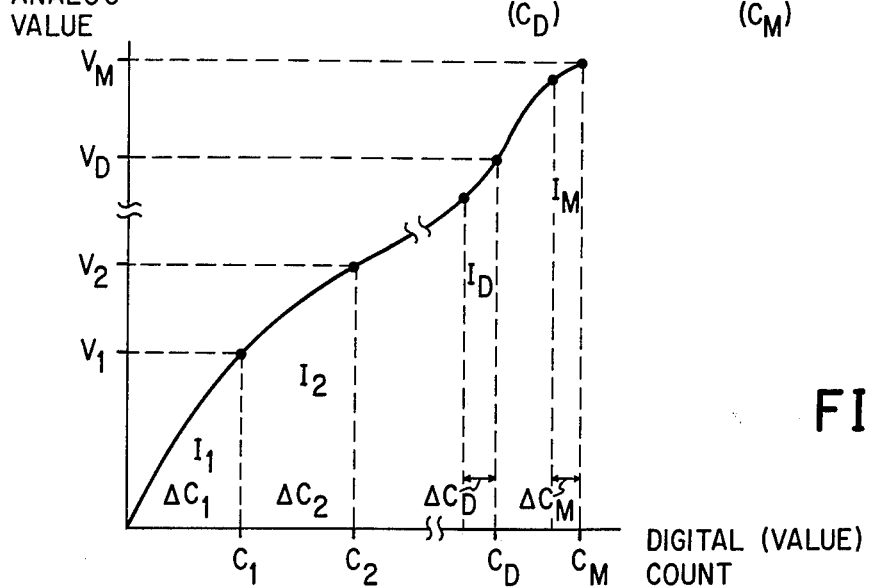
FIG. 2 depicts a typical non-linear ascending curve relating the desired analog value to the digital value which is to be converted thereto.
Figure 3:
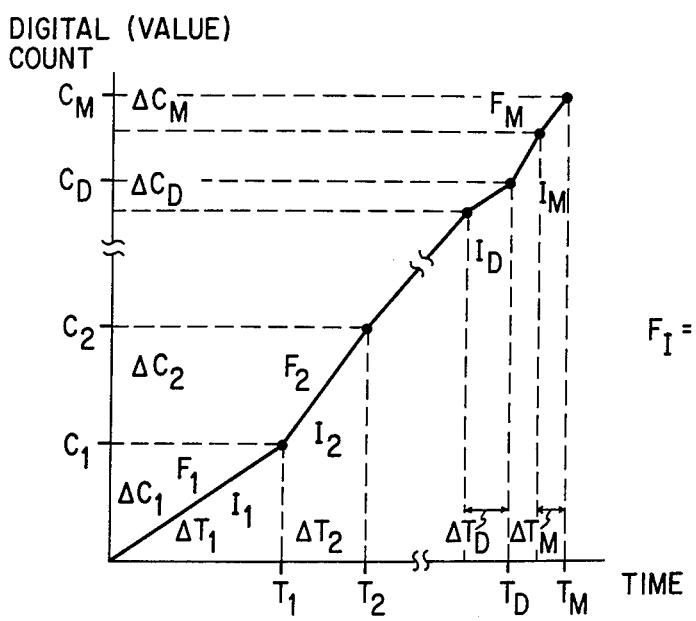
FIG. 3 is a graph depicting the various counting rates and counting intervals employed in the invention.

A non-linear ascending curve relating the desired analog value $V_D$ to the digital value $C_D$ to be converted, such as typified in FIG. 2 can be realized by the invention herein which entails employing not a single uniform counting rate in the counter used for d/a conversion, but rather a plurality of counting rates denoted as F (frequency of counting pulses) and various counting intervals I as shown in FIG. 3. By employing different counting rates, the foregoing described conversion technique can be use directly to perform non-linear d/a conversion, thereby eliminating the need for auxiliary techniques of either performing digital translations prior to the conversion or piece-meal linear approximations after linear conversion as discussed under the Background of the Invention. The counting rates used are determined from the basic equation alluded to earlier, namely, $V_D = V_M \times (T_D/T_M)$.

Considering first the averaging method for transforming the variable width pulse to a proportional analog value, $$T_D = \sum_{I=1}^{I=D} \Delta T_I \text{ and, } T_M = \sum_{I=1}^{I=M} \Delta T_I$$

where $\Delta T_I$ is the time to traverse a count in a given counting interval I, D is the interval containing the digital value to be converted and M is the last interval containing the predetermined (maximum) count. If $C_I$ is equal to the count at the end of a counting interval (all subscripts for values at the end of a given counting interval bear the same number as the interval itself) and $C_{I-1}$ is the count at the end of the preceding counting interval I-1, then $\Delta T_I = (C_I - C_{I-1}/F_I)$, where $F_I$ is the counting rate (counting pulse frequency) in that interval, or $\Delta T_I = \Delta C_I/F_I$, where $\Delta C_I = C_I - C_{I-1}$. Consequently, $$T_D = \sum_{I=1}^{I=D} \frac{\Delta C_I}{F_I} \text{ and, } T_M = \sum_{I=1}^{I=M} \frac{\Delta C_I}{F_I}$$

The counting rates may be determined by arranging that each counting interval I have at least one point where the digital value $C_D$ gives rise to the desired analog value $V_D$ by inherent design as deduced from the non-linear curve of FIG. 2. The counting intervals are determined before the counting rates by the best piecemeal linearwise approximation that can be made to the non-linear curve within the maximum value of intervals permitted by the equipment utilized.

Although in the example to be presented, it is assumed only for convenience that the point $C_D$ lies at the end of each counting interval, it is to be realized that this point may lie anywhere in the interval. Looking to the first counting interval $I_1$, in FIG. 2, it is seen that at the end thereof, an analog value of $V_1$ corresponding to a count of $C_1$ is desired. In this case, $T_D$ is equal to $T_1$ or $C_1/F_1$. Entering this into the basic equation, $$V_1 = V_M \times \frac{C_1/F_1}{C_1/F_1 + \sum_{I=2}^{I=M}\frac{\Delta C_I}{F_I}}$$

Looking to the second counting interval $I_2$, $$T_D = T_2 = \Delta T_1 + \Delta T_2 \text{ or } C_1/F_1 + \frac{C_2 - C_1}{F_2}.$$

Entering this into the basic equation, $$V_2 = V_M \times \frac{\left[C_1/F_1 + \frac{C_2 - C_1}{F_2}\right]}{C_1/F_1 + \frac{C_2 - C_1}{F_2} + \sum_{I=3}^{I=M}\frac{\Delta C_I}{F_I}}$$

It is thus seen that the desired analog signal $V_D$ at the end of any counting segment I containing $C_D =$ $$V_M \times \frac{\sum_{I=1}^{I=D}\frac{\Delta C_I}{F_I}}{\sum_{I=1}^{I=M}\frac{\Delta C_I}{F_I}}$$

Consequently, there are M simultaneous equations corresponding to M counting intervals which can be written in order to solve for the M unknown counting rates $F_I$. If one did not want to be put to the task of solving numerous simultaneous equations, then a trial and error approach could be adopted. In either event, the solution of the equations will yield suitable counting rates so that the individual counts as shown in FIG. 3 will give rise to the desired counterpart analog values. It is of course realized that in between these individual points, the resultant accuracy will depend on how well the individual intervals are matched to the curvilinear sections.

The more counting intervals used, the greater the accuracy.

In order to avoid the difficulty associated with the solution of numerous simultaneous equations when a great number of counting intervals are desired, $T_M$ can be allowed to vary dependent on the digital value to be converted so long as the basic equation is satisfied. By using a fixed counting rate to complete the count to $C_M$ once the digital value for conversion has been reached, it will be seen that the counting rate in each counting interval can be determined without regard to subsequent counting intervals, thereby avoiding the simultaneous equations engendered in the aforementioned approach. Designating this fixed counting rate $F_f$, the desired analog signal $V_D$ at the end of any counting interval I is equal to:

$$V_M \times \frac{\sum_{I=1}^{I=D}\Delta C_I/F_I}{\sum_{I=1}^{I=D}\Delta C_I/F_I + \frac{C_M - C_D}{F_f}}$$

Looking to the first counting interval of FIG. 2, $$V_1 = \frac{C_1/F_1}{C_1/F_1 + \frac{C_M - C_1}{F_f}}.$$

Since the only unknown in this equation is $F_1$, this can be solved for without referring to any other equations. Looking to the second counting interval, $$V_2 = V_M \times \frac{\left[C_1/F_1 + \frac{C_2 - C_1}{F_2}\right]}{C_1/F_1 + \frac{C_2 - C_1}{F_2} + \frac{C_M - C_2}{F_f}}.$$

Since $F_1$ has already been determined by the earlier equation, the only unknown in this equation is $F_2$ which may likewise be solved for. The general equation for determining the counting rate to be used in a given counting segment is as shown above for $V_D$.

Using an integration approach for transforming the pulse width to a proportional analog signal, $$V_D = K \times T_D, \text{ where } T_D = \sum_{I=1}^{I=D}\Delta T_I$$

and K = integration gain factor in volts/unit time and would be equal to $V_M/T_M$ to achieve the desired voltage for a value of $C_M$. Representing $\Delta T_1$ in terms of counts and counting rates, and substituting for K:

$$T_D = \sum_{I=1}^{I=D}\frac{\Delta C_I}{F_I} \text{ and, } V_D = \frac{V_M}{T_M} \times \sum_{I=1}^{I=D}\frac{\Delta C_I}{F_I}.$$

Thus, once having established the counting intervals, $F_1$ can be determined for each interval without regard to the subsequent intervals, obviating the need for a fixed counting rate as used in the averaging method to avoid solving simultaneous equations.

Figure 4:
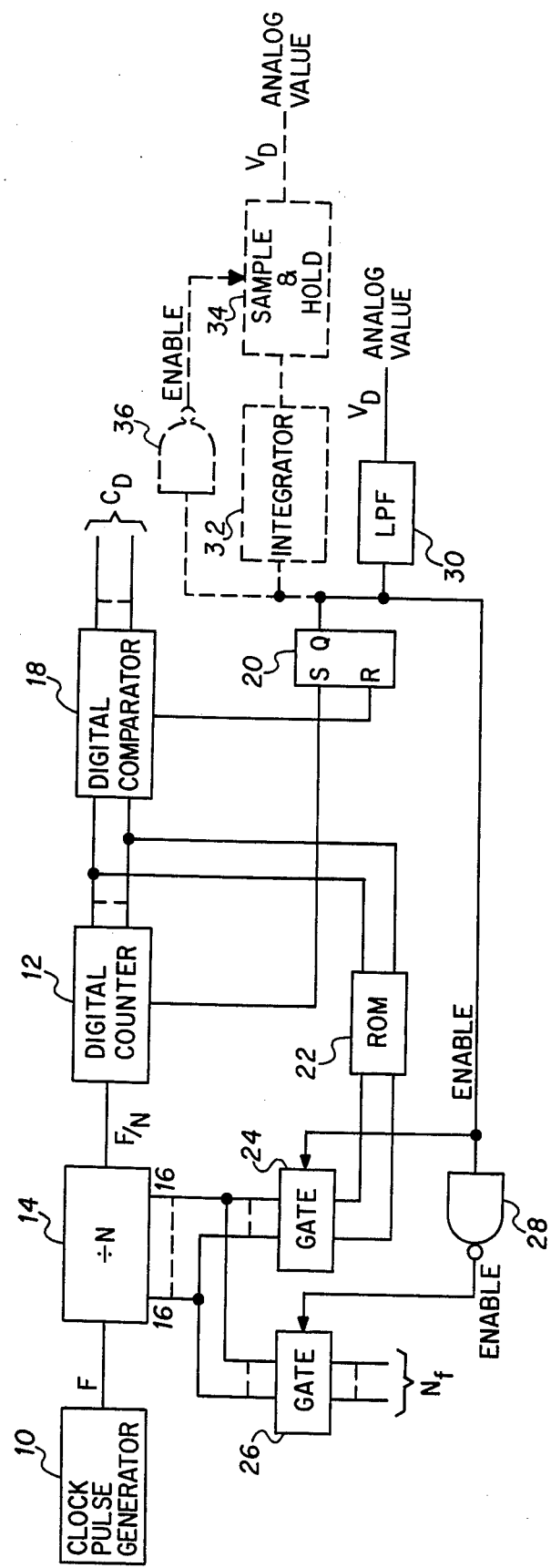
FIG. 4 is a block diagram showing the preferred emodiments for the non-linear d/a converter of the invention.

The preferred embodiments for implementing the foregoing methods of non-linear d/a conversion are shown in FIG. 4. A clock pulse generator 10 supplies counting pulses at a fixed frequency F to a digital counter 12 via a programmable frequency divider 14, the frequency division ratio N of which is programmed by a digital control signal applied thereto over leads 16. The output of digital counter 12 is applied to a digital comparator 18 wherein it is compared against the digital value $C_D$ to be converted, which of course would be entered thereinto by the operator. An RS flip-flop 20 is set (Q output high) by a signal applied to its S input from the digital counter 12 at the beginning of each counting period and reset (Q output low) via a signal applied to its R input from the digital comparator 18 whenever the digital counter 12 achieves the digital value $C_D$ for conversion. Thus, the Q output of flip-flop 20, provides the variable width pulse of FIG. 1, a high signal of magnitude $V_M$ (pulse) being present between the count of 0 and $C_D$ and a low signal being present between the count of $C_D$ and $C_M$.

The digital control signals for programming the frequency division rates N of divider 14 and therefore the counting rates applied to digital counter 12 (F/N) are applied to its leads 16 from a read only memory (ROM) 22 via a gate 24 when enabled by the high Q output of flip-flop 20. This, of course, occurs until the digital value $C_D$ for conversion is achieved by digital counter 12. The output of digital counter 12 is also connected as an input to ROM 22 for controlling its output. The ROM 22 is a memory storage device which allows a frequency division ratio N to be associated with each one of its addresses or memory locations. Although if desired, one could provide individual frequency division ratios for each one of the digital values at the output of digital counter 12, or any combination, this would not effectuate one of the primary objects of the invention, namely, to minimize the amount of requisite memory storage. This object can be realized by establishing a single counting rate for a fixed counting interval as may be determined by the digital leads corresponding to the least significant bits. For example, suppose a binary count of 1,024 ($C_M$) were desired. This requires ten digital leads to fully realize the entire count. But, if a counting interval in which there is a single counting rate is set to extend over a count of 16, for example, then the four least significant bit leads need not be connected to ROM 22. Only the six most significant bit leads would be used for determining the output of ROM 22. So, with all zeroes on these six most significant bit leads, one frequency division ratio N would be entered into frequency divider 14 (corresponding for example to the first counting interval), with all zeroes on the five most significant bit leads another frequency division ratio N would be applied to frequency divider 14 (corresponding for example to the second counting interval), etc. It will be readily apparent that in this example only 64 memory addresses are required, in contradistinction to 1024 if all digital values of the count had to be entered into memory (such as might be used for digital translation in combination with linear d/a conversion to achieve non-linearity). Thus, a substantial savings in memory storage space is realized. Moreover, since the slope of the curve rather than a simple translation is effected by the counting rates a good curve fit can be realized with few counting intervals.

In order to avoid solving numerous simultaneous equations, provision is made in the preferred embodiment for applying a fixed counting rate $N_f$ (corresponding to $F_f$) to the digital counter 12 as discussed earlier, whenever it achieves the digital value $C_D$ to be converted. The fixed digital value $N_f$ which determines the corresponding frequency ratio is applied to frequency divider 14 via a gate 26 which is enabled by the low Q output of flip-flop 20 through an inverter 28 (simultaneously disabling gate 24) at the termination of the variable width pulse. If a fixed counting rate were not used to complete the count following attainment of the digital value $C_D$ to be converted, then gate 26 would of course not be required and gate 24 would always be enabled during the count to allow the programmed counting rates throughout the count (up to $C_M$) to be applied even after the count $C_D$ was attained.

By allowing digital counter 12 to continuously recycle so that a new count is immediately begun each time its output reaches the predetermined maximum count $C_M$, a lowpass filter (LPF) 30 can be used to average the Q output of flip-flop 20 over the counting cycle to provide the desired analog signal output $V_D$. Alternatively, the lowpass filter 30 can be replaced with an integrator 32 and sample and hold circuit 34 which samples the integrator output at the time that the digital value $C_D$ is achieved in response to an enable signal received from the Q output of flip-flop 20 via inverter 36 (lagging edge of pulse constituting the enable signal to trigger the sample). If a recycling digital counter 12 were used then integrator 32 would of course be designed to initialize its output to zero at the beginning of each counting cycle.

Thus, the invention is seen to provide a wholly digital technique which is simple and inexpensive in design, albeit effective, for performing non-linear d/a conversion. Large memory storage units or piece-meal linear approximation circuits need not be combined with linear digital analog converters as done heretofore. Since modifications to the foregoing may occur to those skilled in the art which would not necessarily constitute departures from the scope and spirit of the invention, the Detailed Description is to be considered merely exemplary an not circumscriptive of the invention as will now be claimed hereinbelow.

What is claimed is:

1. A non-linear digital-to-analog converter, comprising:
    digital counting means for providing a predetermined count, having a plurality of counting rates and counting intervals with the duration of each interval being variable and independent from that of the other intervals and the rate in each interval being determined by a control signal applied thereto, there being a different control signal for each one of said counting rates;
    comparator means for providing a pulse until the count in said counting means reaches the digital value to be converted;
    indicating means responsive to said comparator means for providing an output signal whose magnitude is proportional to the width of said pulse, and
    control storage means for providing said control signals from the output of said digital counting means such that the output signal from said indicating means at some point during each counting interval corresponds to the desired equivalent analog value for the digital value of the count at that point and the control signal intermediate the termination of said pulse and the completion of said predetermined count always assumes the same value for affording a single fixed counting rate during that period.

2. The converter of claim 1 wherein said counting means comprises a digital counter, a source of pulses having a fixed frequency and a programmable divider circuit for interconnecting said digital counter with said pulse source, said divider circuit being responsive to said control signals for providing the appropriate division ratios to achieve said plurality of counting rates with which to drive said digital counter.

3. The converter of claim 1 wherein said indicating means is a lowpass filter for averaging said pulse over each complete counting cycle for said counting means.

4. The converter of claim 1 wherein said indicating means is an integrator for integrating the output of said comparator means and a sample and hold circuit for sampling the output of said integrator at the termination of said pulse and holding the sampled value until the next sample is taken.

5. A method of performing non-linear digital-to-analog conversion, comprising:
- digitally counting to a predetermined count, using a plurality of counting rates and counting intervals with the duration of each interval being variable and independent from that of the other intervals and the rate in each interval being determined by a control signal, there being a different control signal for each one of said counting rates;
- generating a pulse until said counting reaches the digital value to be converted;
- developing an output signal whose magnitude is proportional to the width of said pulse, and
- providing said control signals from the digital counting values such that the output signal at some point during each counting interval corresponds to the desired equivalent analog value for the digital value of the count at that point and the control signal intermediate the termination of said pulse and the completion of said predetermined count always assumes the same value for affording a single fixed counting rate during that period.

6. The method of claim 5 wherein said counting comprises generating a pulse train having a fixed frequency and dividing down the frequency with any one of a plurality of divider ratios appropriate for achieving said counting rates in response to said control signals prior to performing said counting.

7. A non-linear digital-to-analog converter, comprising:
- a source of clock pulses having a fixed frequency;
- a programmable frequency divider connected to receive said clock pulses for dividing their frequency by any one of a plurality of division ratios in response to control signals applied thereto the duration of each ratio being variable and independent from that of the other ratio durations, there being a different control signal for each one of said division ratios;
- a digital counter connected to the output of said divider for providing a predetermined count;
- a digital comparator for providing an indication when the output of said digital counter matches the digital value to be converted;
- bilevel signal means connected to said digital counter and said comparator for providing a first signal until the count in said digital counter reaches the digital value to be converted and a second signal thereafter until it achieves said predetermined count;
- indicating means for providing an output signal whose magnitude is proportional to the duration of said first signal, and
- control storage means for providing said control signals from the output of said digital counter such that the output of said indicating means at some point during each counting interval corresponds to the desired equivalent analog value for the digital value of the count at that point and the control signal intermediate the termination of said pulse and the completion of said predetermined count always assumes the same value for affording a single fixed counting rate during that period.

8. The converter of claim 7 wherein said indicating means is a lowpass filter for averaging said first signal over the time for said digital counter to achieve said predetermined count.

9. The converter of claim 7 wherein said indicating means is an integrator for integrating said first signal and a sample and hold circuit for sampling the integrated value at the termination of said first signal and holding the sampled value until the next sample is taken.

* * * * *